(12) United States Patent
Kawauchi et al.

(10) Patent No.: US 7,348,497 B2
(45) Date of Patent: Mar. 25, 2008

(54) MOUNTING STRUCTURE FOR ELECTRONIC COMPONENTS

(75) Inventors: Hidetaka Kawauchi, Hitachi (JP); Yoshiaki Ishigami, Hitachi (JP); Kinya Yamazaki, Hitachi (JP); Juhyun Yu, Hitachi (JP); Tenpei Inoue, Hitachi (JP); Hiroki Katayama, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 164 days.

(21) Appl. No.: 11/178,490

(22) Filed: Jul. 12, 2005

(65) Prior Publication Data

US 2006/0065432 A1      Mar. 30, 2006

(30) Foreign Application Priority Data

Sep. 29, 2004   (JP) ............................. 2004-283755

(51) Int. Cl.
*H05K 1/16*       (2006.01)
(52) U.S. Cl. .................. 174/260; 174/261; 361/772
(58) Field of Classification Search ............. 174/260, 174/267; 361/767–776, 807–812
See application file for complete search history.

(56) References Cited

U.S. PATENT DOCUMENTS

| | | | | |
|---|---|---|---|---|
| 5,414,220 A | * | 5/1995 | Hanato et al. | 174/254 |
| 5,616,888 A | * | 4/1997 | McLaughlin et al. | 174/260 |
| 6,310,780 B1 | * | 10/2001 | Tamura et al. | 361/761 |
| 6,807,021 B2 | | 10/2004 | Kurashima | |
| 6,977,423 B2 | * | 12/2005 | Kohmoto et al. | 257/431 |

FOREIGN PATENT DOCUMENTS

| | | |
|---|---|---|
| JP | 2003-209294 A | 7/2003 |
| JP | 2004-071890 A | 3/2004 |

\* cited by examiner

*Primary Examiner*—Jeremy C Norris
(74) *Attorney, Agent, or Firm*—Foley & Lardner LLP

(57) ABSTRACT

A mounting structure for electronic components is provided with a circuit board that has a step portion formed at one end portion thereof. The step portion is sandwiched by a lead of the electronic component so as to secure the lead to the step portion. The step portion is formed by perforating a region on one surface of the circuit board, and then peeling a part of the circuit board corresponding to the perforated region so as to reduce the thickness of the circuit board at the region.

7 Claims, 20 Drawing Sheets

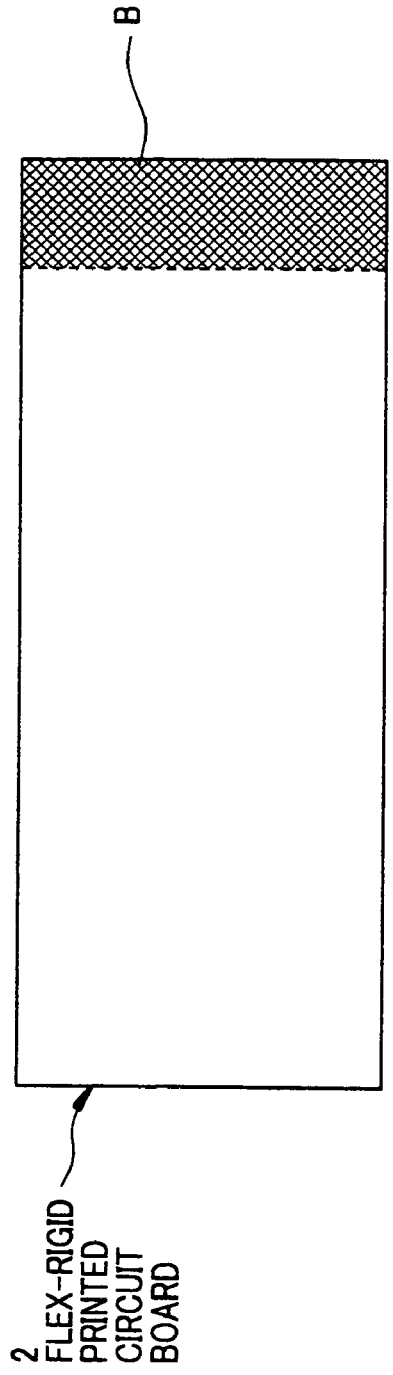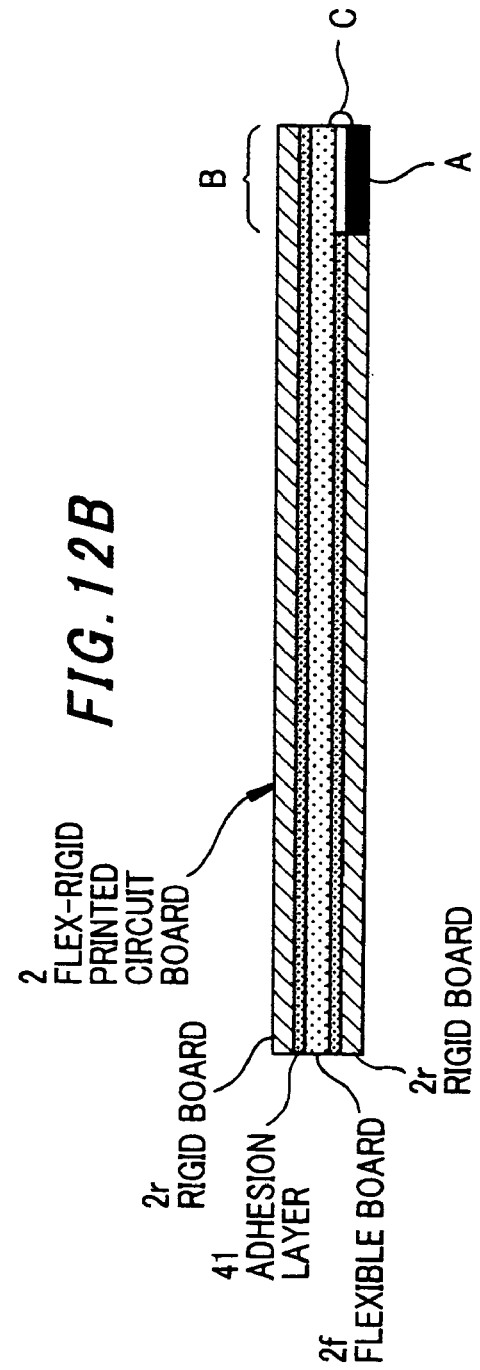

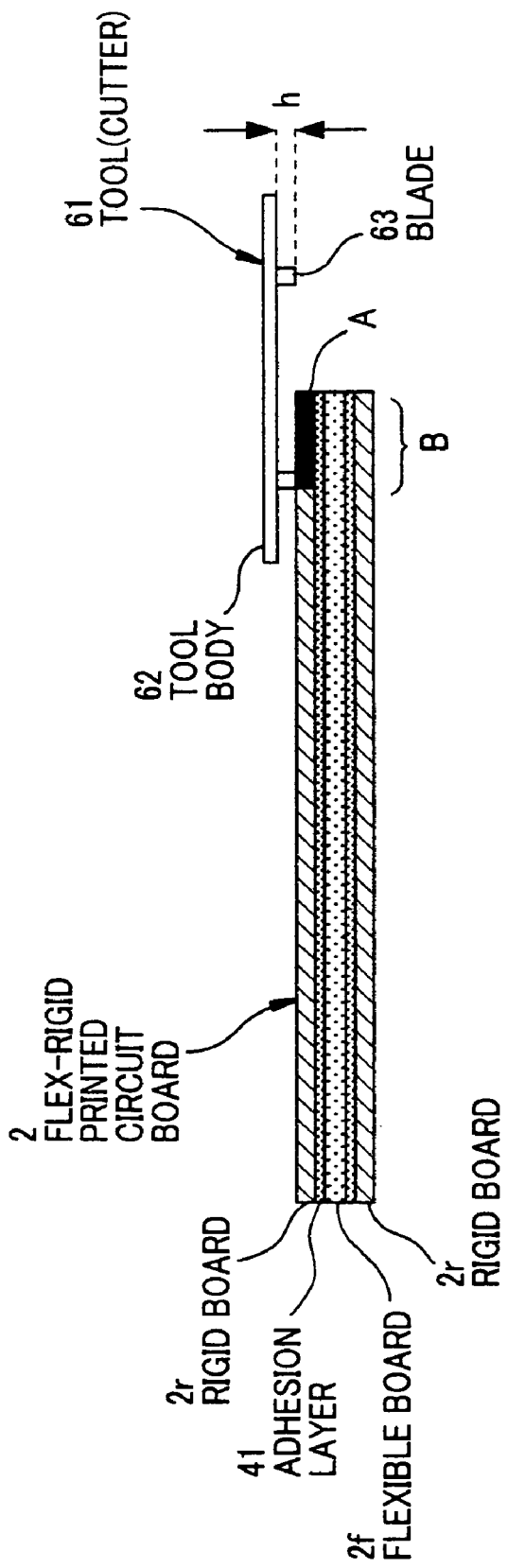

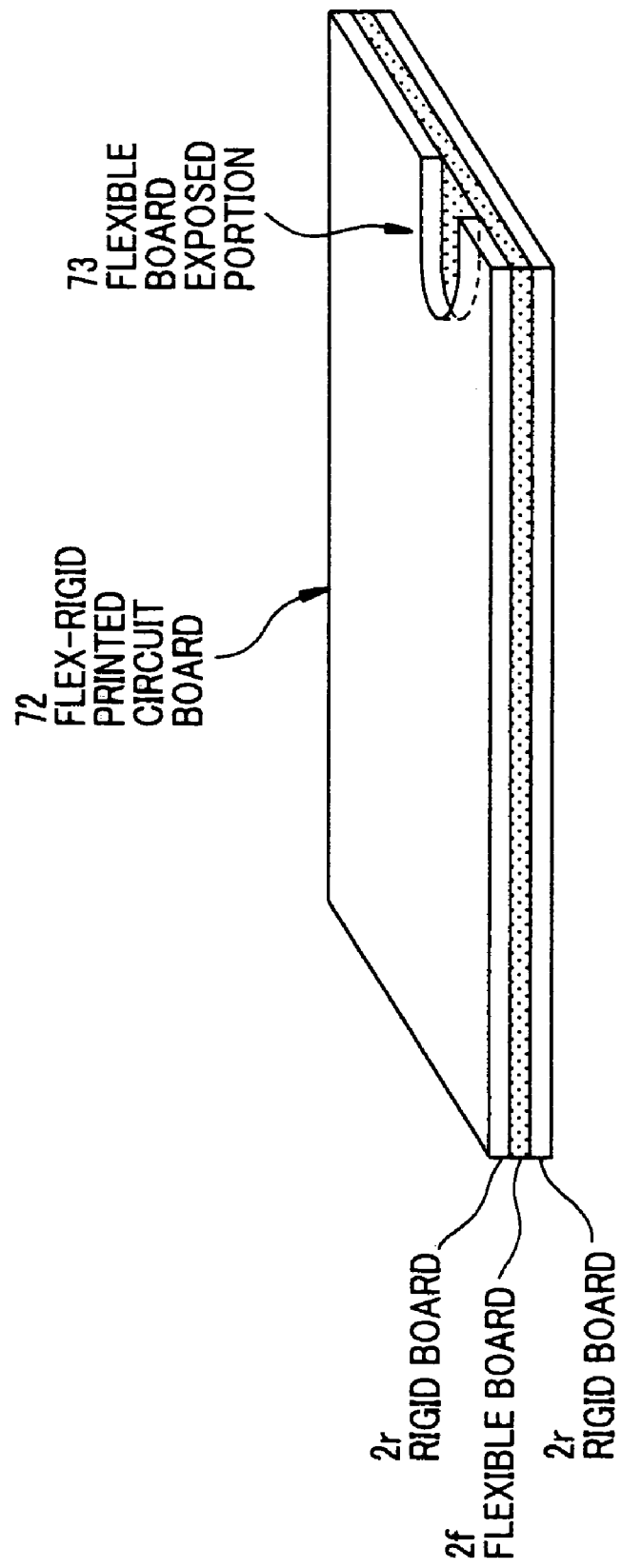

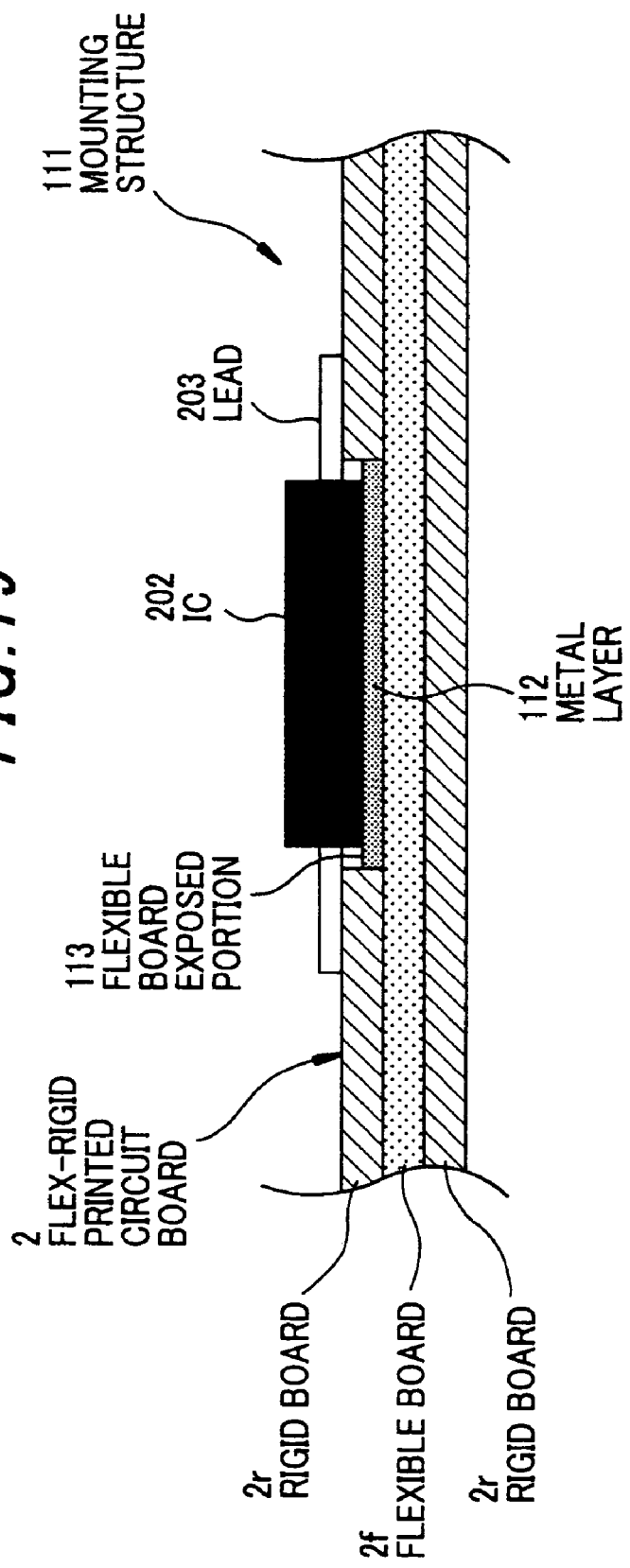

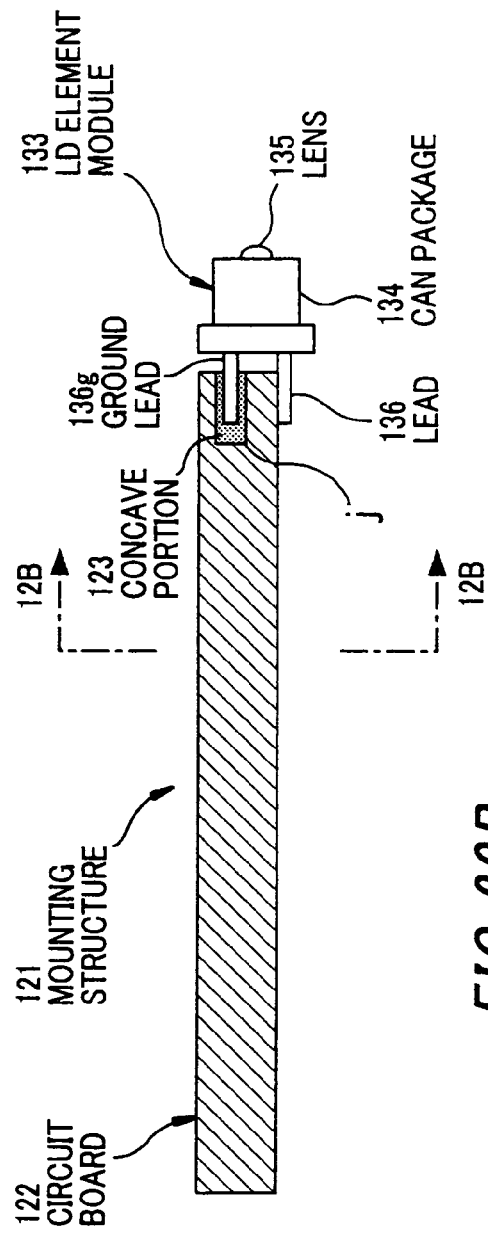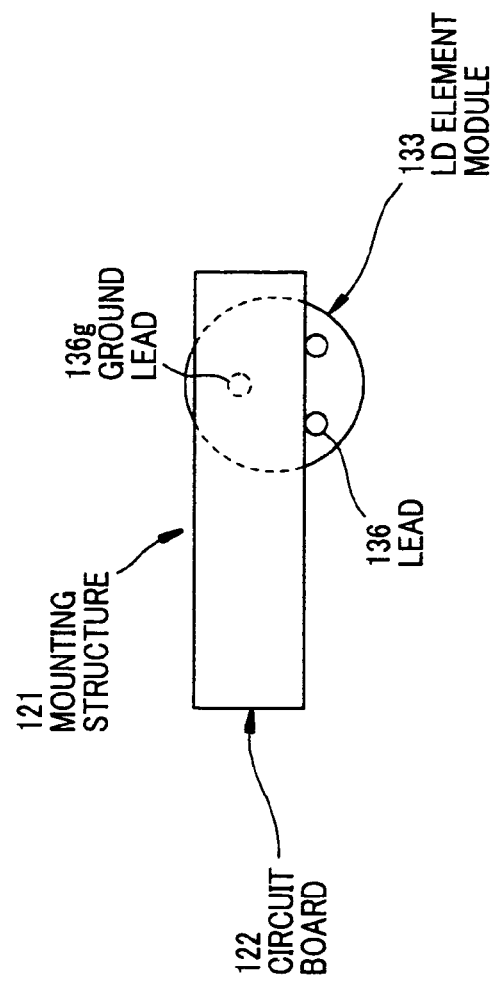

MOUNTING STRUCTURE FOR ELECTRONIC COMPONENTS

The present application is based on Japanese patent application No. 2004-283755, the entire contents of which are incorporated herein by reference.

BACKGROUND OF THE INVENTION

1. Field of the Invention

This invention relates to a mounting structure that an electronic component is mounted on a flex-rigid board where the electronic component has a lead interval narrower than the thickness of the flex-rigid board, and relates to an optical transceiver using the same.

2. Description of the Related Art

As shown in FIG. 1, an LD (a semiconductor laser) element module 133 (e.g., a package with LD or an LD sub-assembly) may be mounted on a rigid-flex board (or flex-rigid printed circuit board) 132, where the LD element module 133 has a lead interval w2 (w1>w2) narrower than the thickness w1 of the rigid-flex board 132. Also, a PD (a photodiode) element module (e.g., a package with PD or a PD sub-assembly) may be mounted The board 132 is composed of a rigid board 132r and a flexible board 132f, which are laminated alternately. The LD element module 133 is mainly composed of: a can package 134 that is made of metal with a high heat radiating property and has an airtight inner portion; an LD element that is placed in the can package 134 and emits an optical signal; a lens 135 that collects light emitted from the LD element; and plural leads 136.

Several methods of attaching the lead 136 to the board 132 are assumed as follows.

(1) As shown in FIG. 2, the first is an electronic component mounting structure 141 that the lead 136 subjected to the lead forming (being bent in part) is attached onto one surface of the board 132.

(2) As shown in FIG. 3, the second is a method that the lead 136 is attached to the board 132 while sandwiching the board 132.

(3) As shown in FIG. 8, the third is an electronic component mounting structure 201 that an IC 202 is mounted on the board 132. The IC 202 has plural leads 203 with leads extending linearly in the horizontal direction. Therefore, the leads 203 need to be subjected to the lead forming when they are attached onto the board 132.

The related arts of the invention are disclosed in, for example, Japanese patent application laid-open Nos. 2004-71890 and 2003-209294.

However, the first method (1) and the second method (2) have problems as described below.

Namely, (i) since in the first method (1) the lead 136 is subjected to the lead forming, it takes time and a trouble to form the lead.

(ii) The second method (2) where the board 132 is sandwiched by the leads 136 allows the LD module 133 to be attached more securely than the first method (1) where the leads being all subjected to the lead forming are attached onto one surface of the board 132. However, in the second method (2), a stress may be collected in the lead 136 to support the can package 134 to reduce the reliability of the lead 136 and the board 132.

Further, in the second method (2), since the thickness w1 of the board 132 is greater than the lead interval w2, the lead 136 may collide with the board 132 as shown in FIG. 4 when the lead interval w2 is kept as it is.

To solve the problems, a structure may be assumed that the board 132 is sandwiched by elongated leads 136. For example, as shown in FIG. 5 and FIG. 7, which is a plain view corresponding thereto, an electronic component mounting structure 171 is assumed that the leads 136 are attached thereto while being forcedly bent and spread. Further, as shown in FIG. 6 and FIG. 7, which is the plain view corresponding thereto, an electronic component mounting structure 181 is assumed that one of the leads 136 is subjected to the lead forming on the back side of the board 132.

However, the mounting structures as shown in FIGS. 5 and 6 have problems as described below. When an RF signal (e.g., 5 GHZ or more) passes through the lead 136, the high-speed signal may deteriorate due to the elongation of the lead 136. In other words, a gap L1 must be generated between the end of the board 132 and the can package 134 and, therefore, the lead 136 cannot be mounted in the shortest length on the board 132, i.e., the LD element module 133 cannot be mounted in the shortest distance on the board 132.

Further, when the leads 136 are forcedly bent and spread as in the mounting structure 171, an excessive stress is applied to the base of the lead 136 and, thereby, the airtightness may be broken between the lead 136 and the can package 134.

On the other hand, the mounting structure 201 as shown in FIG. 8 has problems as described below. Since the leads 203 are subjected to the lead forming, the problems (i), (ii) as described earlier are generated and, further, when the RF signal (e.g., 5 GHz or more) passes through the lead 203, the high-speed signal may deteriorate at the bent portion of the lead 203, thus causing deterioration in the RF characteristics. Also, since the heat radiation is not considered, the structusre will suffer from a low heat radiating property.

SUMMARY OF THE INVENTION

It is an object of the invention to provide a mounting structure for electronic components that can prevent the deterioration of a high-speed signal as much as possible so as to enhance the reliability of the lead and the board.

It is another object of the invention to provide an optical transceiver using the mounting structure.

(1) According to one aspect of the invention, a mounting structure for electronic components comprises:

a circuit board; and an electronic component mounted on the circuit board;

wherein the circuit board comprises a step portion formed at one end portion thereof, and the step portion is sandwiched by a lead of the electronic component so as to secure the lead to the step portion.

(2) According to another aspect of the invention, a mounting structure for electronic components comprises:

a rigid-flex board comprising a thickness w1;

an electronic component mounted on the rigid-flex board, the electronic component comprising a lead interval w2 that is smaller than the thickness w1, wherein the rigid-flex board comprises a step portion formed at one end portion thereof, and the step portion is sandwiched by a lead of the electronic component so as to secure the lead to the step portion.

It is preferred that the rigid-flex board comprises a flexible board; the step portion comprises a flexible board exposed portion at which the flexible board is exposed.

It is preferred that the lead is secured substantially linearly to the step portion.

It is preferred that the step portion comprises a thickness w3, the electronic component comprises a lead interval w2, and the thickness w3 is smaller than the lead interval w2.

It is preferred that the step portion is formed in part at the one end portion of the circuit board.

(3) According to another aspect of the invention, a mounting structure for electronic components comprises:
  a circuit board; and
  an electronic component mounted on the circuit board;
  wherein the circuit board comprises a step portion formed at a central portion thereof, and a metal layer formed on the step portion, and
  the electronic component is mounted on the metal layer.

(4) According to another aspect of the invention, a mounting structure for electronic components comprises:
  a rigid-flex board; and
  an electronic component mounted on the rigid-flex board;
  wherein the rigid-flex board comprises a step portion formed at a central portion thereof, and a metal layer formed on the step portion, and
  the electronic component is mounted on the metal layer.

It is preferred that the rigid-flex board comprises a flexible board; the step portion comprises a flexible board exposed portion at which the flexible board is exposed.

It is preferred that the lead is secured substantially linearly to the step portion.

It is preferred that the step portion is formed by perforating a region on one surface of the circuit board, and then peeling a part of the circuit board corresponding to the perforated region so as to reduce the thickness of the circuit board at the region.

(5) According to another aspect of the invention, a mounting structure for electronic components comprises:
  a circuit board; and
  an electronic component mounted on the circuit board;
  wherein the circuit board comprises a concave portion formed at an end face thereof, and
  the electronic component comprises a lead inserted and secured within the concave portion.

(6) According to another aspect of the invention, an optical transceiver comprises:
  the mounting structure composed as described above in (1) to (5).

BRIEF DESCRIPTION OF THE DRAWINGS

The preferred embodiments according to the invention will be explained below referring to the drawings, wherein:

FIG. 12A is a bottom view showing a rigid-flex board 2 before forming a step portion in the first embodiment;

FIG. 12B is a cross sectional view showing the details of the rigid-flex board 2 in FIG. 12A;

FIG. 14 is a cross sectional view showing a process of forming the mounting structure of the first embodiment;

FIG. 15 is a perspective view showing a modification of the rigid-flex board in the first embodiment;

FIG. 19 is a cross sectional view showing a mounting structure for electronic components in a second preferred embodiment according to the invention;

FIG. 20A is a partial cross sectional view showing a mounting structure for electronic components in a third preferred embodiment according to the invention; and FIG. 20B is a cross sectional view cut along a line 12B-12B in FIG. 20A.

DETAILED DESCRIPTION OF THE PREFERRED EMBODIMENTS

First Embodiment

Figure 9:
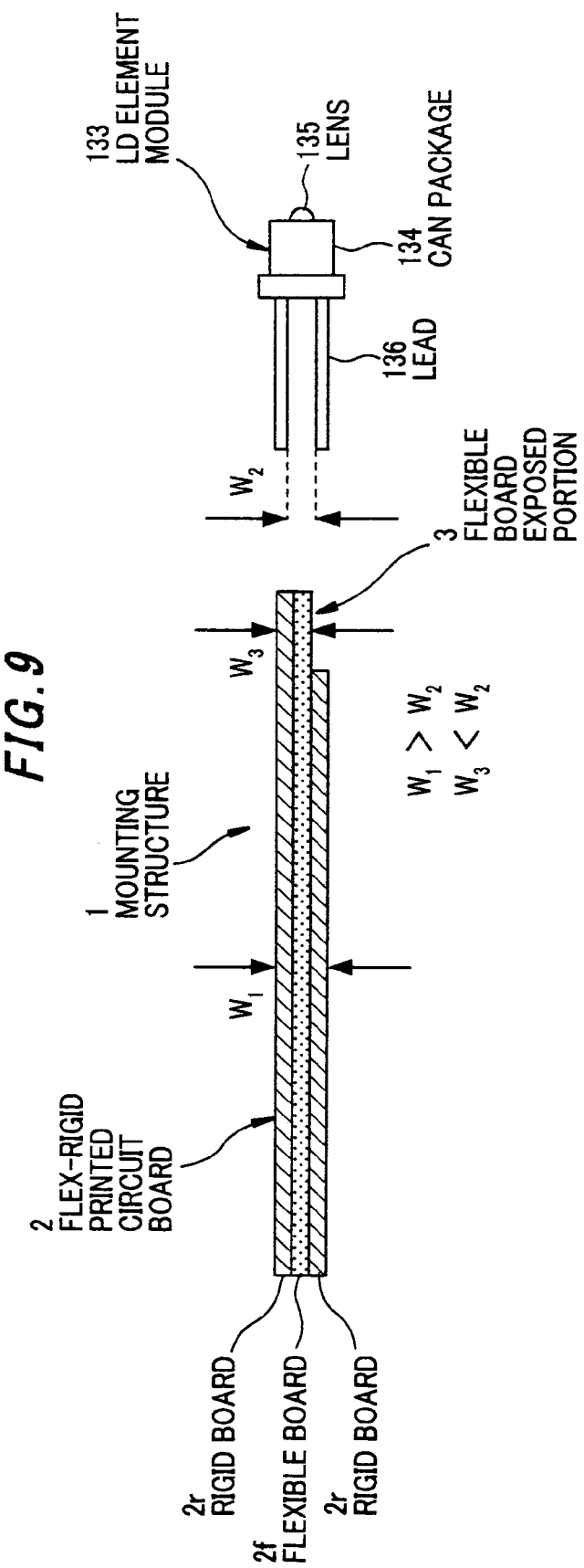
FIG. 9 is a broken partial cross sectional view showing a mounting structure for electronic components in a first preferred embodiment according to the invention.

FIG. 9 is a broken partial cross sectional view showing a mounting structure for electronic components in the first preferred embodiment according to the invention.

Figure 1:
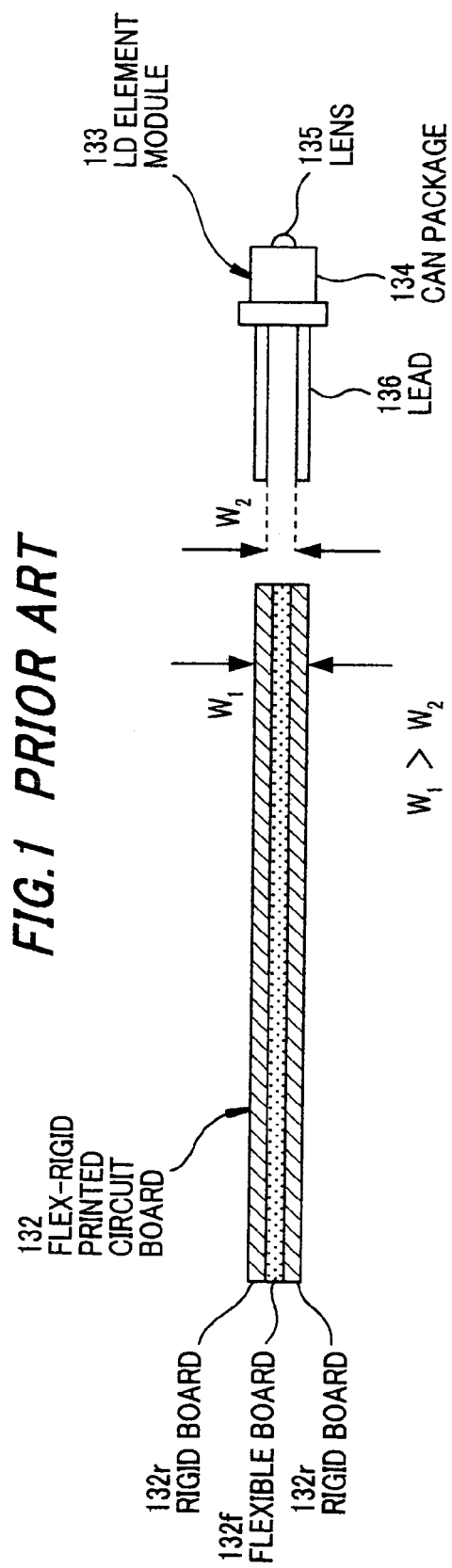
FIG. 1 is a broken partial cross sectional view showing the conventional electronic component mounting structure.

As shown in FIG. 9, the electronic component mounting structure 1 of the embodiment is mainly composed of: a rigid-flex (or flex-rigid) board 2, which is a circuit board; and an electronic component, especially an optical module such as an LD module 133 as shown in FIG. 1.

The board (flex-rigid printed circuit board) 2 is composed of a rigid board 2r and a flexible board 2f, which are alternately laminated in three layers as shown in FIG. 9. At one end portion in one surface of the board 2, a flexible board exposed portion 3 is formed where the flexible board 2f is exposed as a step portion.

As shown in FIG. 9, the board 2 is formed in three-layer structure, and the flexible board exposed portion 3 is formed such that the first layer rigid board 2r (=the lower rigid board 2r) and the second layer flexible board 2f compose the step portion. The flexible board exposed portion 3 is a portion where a part of the flexible board 2f composing the board 2 is exposed.

Between a thickness w1 of the board 2 except the flexible board exposed portion 3 and a lead interval w2 of the LD element module 133, there is a relationship of w1>w2.

Namely, the lead interval w2 is narrower than the thickness w1. Further, between a thickness w3 of the flexible board exposed portion 3 and the lead interval w2, there is a relationship of w3<w2. Namely, the thickness w3 is smaller than the lead interval w2. Herein, the lead interval w2 means an interval between neighboring leads 136 when the optical axis of the LD element module 133 is placed parallel to the length direction (i.e., the horizontal direction in FIG. 9) of the board 2.

(Process of Mounting the Electronic Component Mounting Structure 1)

The process of mounting the electronic component mounting structure 1 will be explained below.

Figure 10:
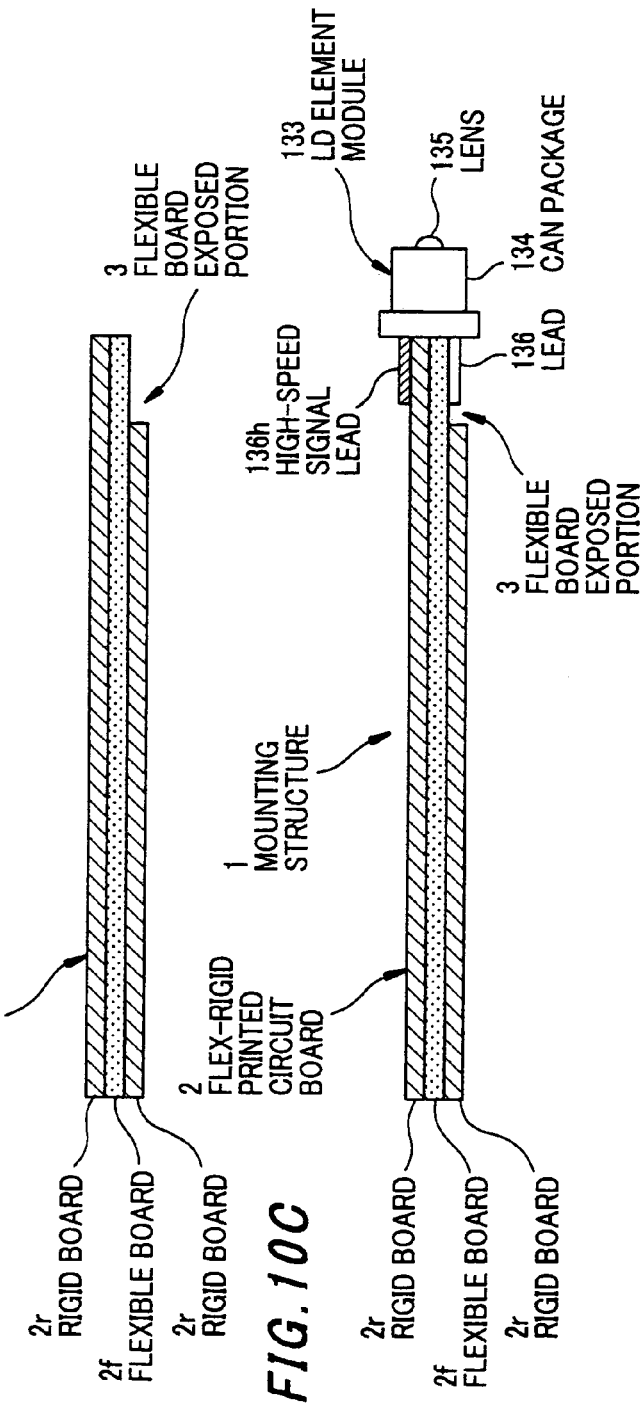
FIGS. 10A to 10C are cross sectional view showing a process of mounting the mounting structure of the first embodiment.

At first, as shown in FIG. 10A, apart (portion A in FIG. 10A) of the first layer rigid board 2r is removed (or peeled) at the one end portion on the one surface of the board 2 so as to form the flexible board exposed portion 3 as shown in FIG. 10B.

A length L2 (the length of the flexible board exposed portion 3) of region B where the first layer rigid board 2r is removed (or peeled) is determined such that, when the LD element module 133 in FIG. 9 is mounted on the board 2, a predetermined connection strength can be obtained while the optical axis of the LD element module 133 is placed parallel to the length direction of the board 2.

The reason why the rigid board 2r can be removed is as follows.

As shown in FIGS. 12A and 12B, a rigid-flex board is generally provided with an adhesion layer 41 that is formed by coating an adhesive material between the first layer rigid board 2r (=the lower rigid board 2r) and the flexible board 2f and between the flexible board 2f and the second rigid board 2r (=the upper rigid board 2r) so as to allow the adhesion between the rigid board 2r and the flexible board 2f.

However, in the embodiment, the board 2 is prepared such that, in region B where the rigid board 2r is to be removed, there is provided a portion (i.e., portion C in FIG. 12B) without the adhesion layer 41 between the removal-expected portion A of the first layer rigid board 2r and the flexible board 2f. Thereby, the portion A of the first layer rigid board 2r can be easily removed such that the one end portion of the board 2 can have a reduced thickness.

The portion C without the adhesion layer 41 is formed by, for example, (i) masking a portion where the adhesion layer 41 is expected to be removed and then coating the adhesive material. Alternatively, (ii) when a common rigid-flex board with the adhesive material coated on the entire surface is used, the adhesion layer 41 between the removal-expected portion A of the first layer rigid board 2r and the flexible board 2f may be removed as well as the portion A of the first layer rigid board 2r by using, e.g., a tool (cutter) 61 as described later in FIG. 14.

Figures 13A, 13B:
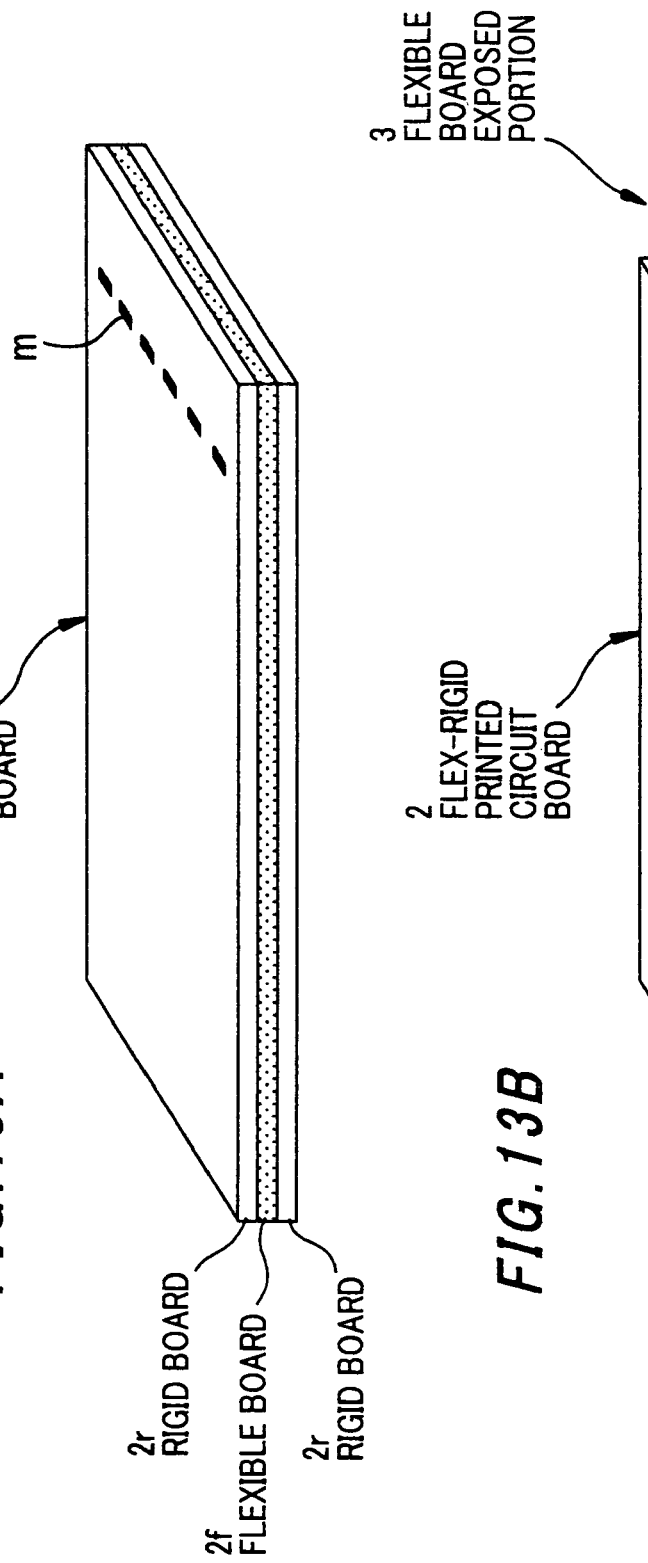
FIGS. 13A and 13B are perspective views showing a process of forming the mounting structure as shown in FIGS. 10A and 10B.

The method of making the electronic component mounting structure 1 as shown in FIGS. 10A and 10B can be conducted by previously perforating in line m the first layer rigid board 2r on the back side of the board 2 as shown in FIG. 13A, then removing the end portion of the first layer rigid board 2r along the perforated line m. Thereby, as shown in FIG. 13B, the flexible board exposed portion 3 can be formed at the end portion on the one surface of the board 2.

In perforating in line m the first layer rigid board 2r, for example, the tool (cutter) 61 as shown in FIG. 14 may be used. The tool 61 is composed of a tool body 62 in planar form, and plural blades 63 that are attached to the tool body 62 and its height h can be adjusted. In the embodiment, the blade height h is adjusted such that it is slightly lower than the sum of the thickness of the rigid board 2r and the thickness of the adhesion layer 41.

The perforated line m as shown in FIG. 13A is formed, without breaking the flexible board 2f, such that the tool 61 is placed on the board 2, the blade 63 is positioned at the other end of the removal-expected region B of the rigid board 2r, and the tool 61 is pressed down against the surface of the board 2.

After forming the flexible board exposed portion 3, as shown in FIG. 10C, the leads 136 of the LD element module 133 are processed to have a length shorter than the length L2 of the flexible board exposed portion 3. Then, both faces of the flexible board exposed portion 3 (which means a laminate portion of only the flexible board 2f and the upper rigid board 2r) is sandwiched by the leads 136, and the leads 136 are solder-bonded to both faces of the flexible board exposed portion 3.

In the above bonding process, the leads 136 of the LD element module 133 are substantially linearly to the flexible board exposed portion 3. Also, the end of the board 2 is made to contact the bottom face of the can package 134. Alternatively, the end of the board 2 may be placed away from the bottom face of the can package 134 while having therebetween such a gap that the RF signal does not deteriorate. The gap is in general 1 mm or less in consideration of the workability.

As shown in FIG. 10C, a high-speed signal lead 136h (e.g., a lead through which an RF signal of 5 GHz or more passes) of the leads 136 is bonded to a pad (not shown) formed on the surface of the third rigid board 2r (the upper rigid board 2r). The high-speed signal lead 136h is connected to, e.g., an LD driver to operate the LD element. Low-speed signal leads (for a power supply etc.) except the high-speed signal lead 136h are bonded to a pad (not shown) formed on the third layer rigid board 2r or the second layer flexible board 2f.

The board 2 generally has a thickness w1 of 0.9 to 1.0 mm. The rigid board 2r and the flexible board 2f have a thickness of about 0.3 mm. The LD element module 133 frequently used has a lead interval w2 of 1 mm or so (i.e., 0.9 to 1.0 mm). In order to mount it in higher density, the LD element module 133 (or a PD element module) is to be downsized. Therefore, the lead interval w2 needs to be reduced.

As described above, by removing the portion A of the rigid board 2r, the LD element module 133 can be easily mounted on the board 2 while allowing the end of the board 2 to be near the base of the lead 136. Thus, the electronic component mounting structure 1 as shown in FIG. 10C can be obtained.

Functions in the First Embodiment

The electronic component mounting structure 1 is constructed such that the flexible board exposed portion 3 is formed at one end portion of the board 2 and is sandwiched by the leads 136 of the LD element module 133 to secure the leads 136 to the flexible board exposed portion 3.

Thus, even when the lead interval w2 of the LD element module 133 is smaller than the thickness w1 of the board 2, the LD element module 133 can be easily mounted on the board 2 since the thickness w3 of the flexible board exposed portion 3 is smaller than the lead interval w2.

Especially, by linearly securing the high-speed signal lead 136h of the LD element module 133 to the flexible board exposed portion 3, the LD element module 133 can be connected to the board 2 while allowing the LD element module 133 to be close to the end of the board 2 as much as possible. Namely, it is not necessary to form the gap between the end of the board 2 and the LD element module 133.

Thus, in the electronic component mounting structure 1, since the high-speed signal lead 136h can be attached in the shortest distance to the board 2 (i.e., since the LD element module 133 can be mounted in the shortest distance on the board 2), the deterioration of the high-speed signal can be prevented as much as possible.

Figure 2:
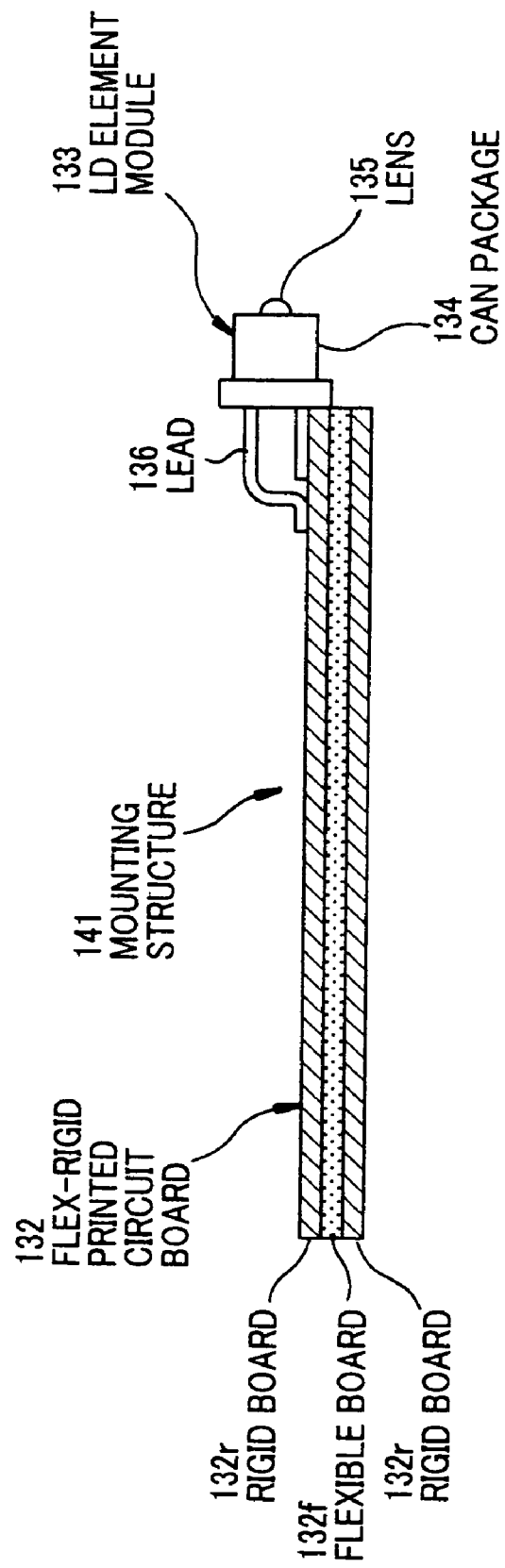
FIG. 2 is a partial cross sectional view showing the first conventional method of mounting an electronic component.
Figure 3:
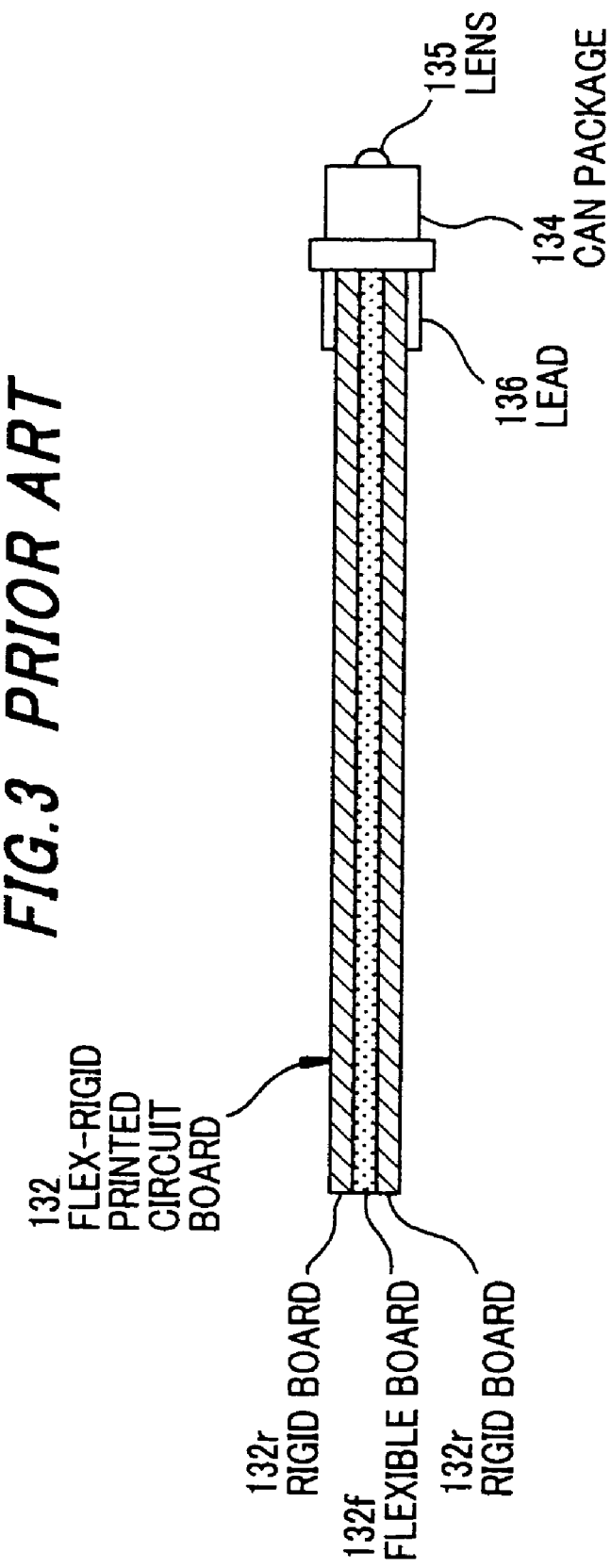
FIG. 3 is a partial cross sectional view showing the second conventional method of mounting the electronic component.
Figure 4:
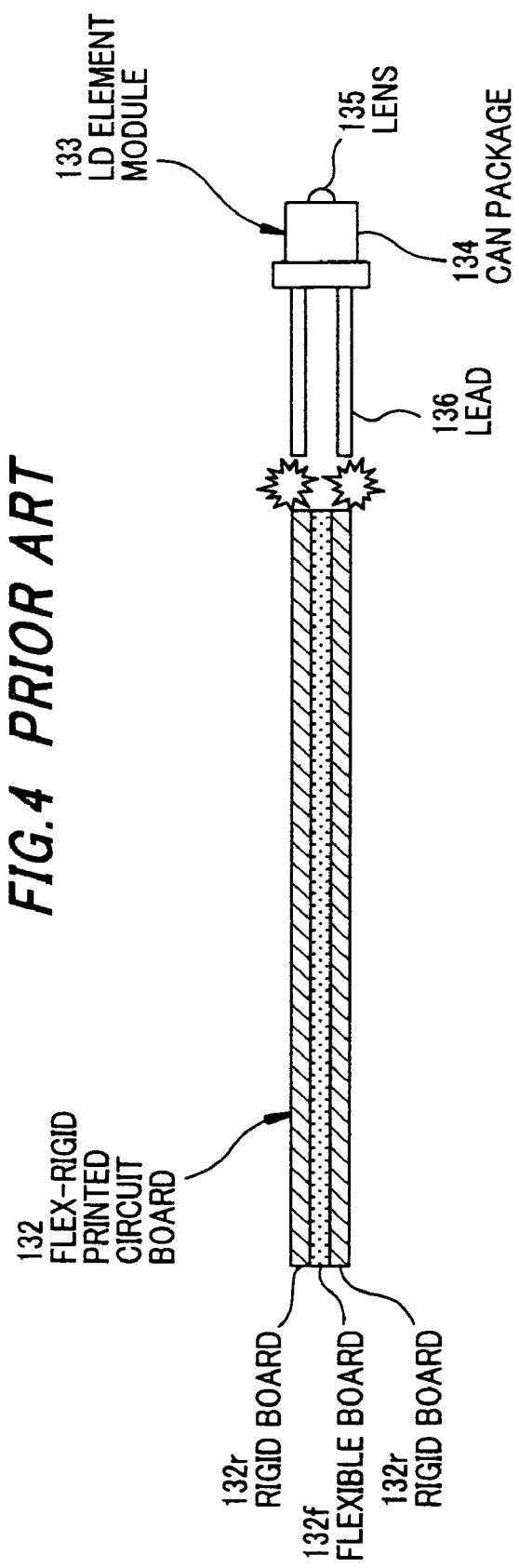
FIG. 4 is a partial cross sectional view illustrating a problem in the second conventional method.
Figure 5:
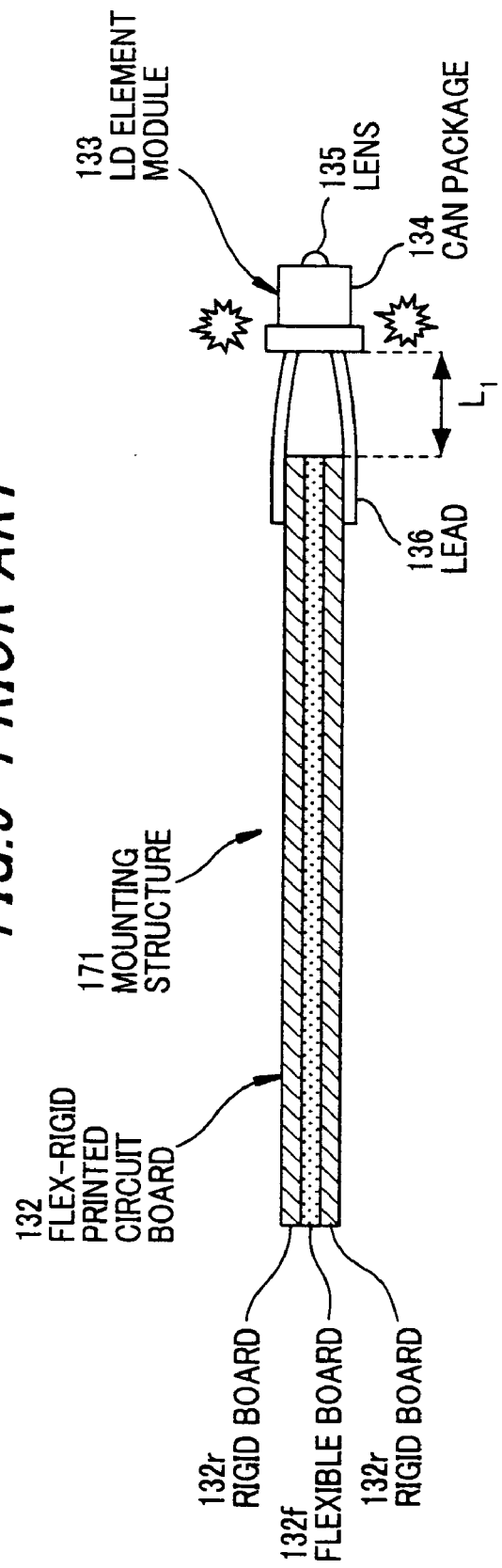
FIG. 5 is a partial cross sectional view illustrating a solution to the problem.
Figure 6:
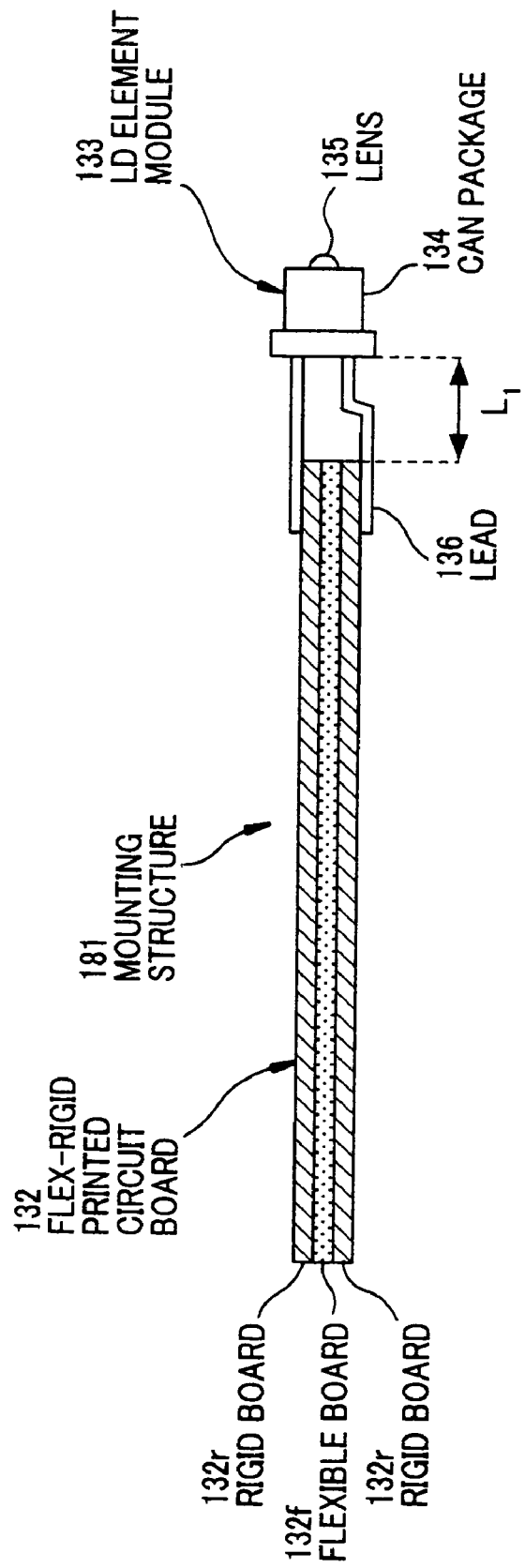
FIG. 6 is a partial cross sectional view illustrating another solution to the problem.
Figure 7:
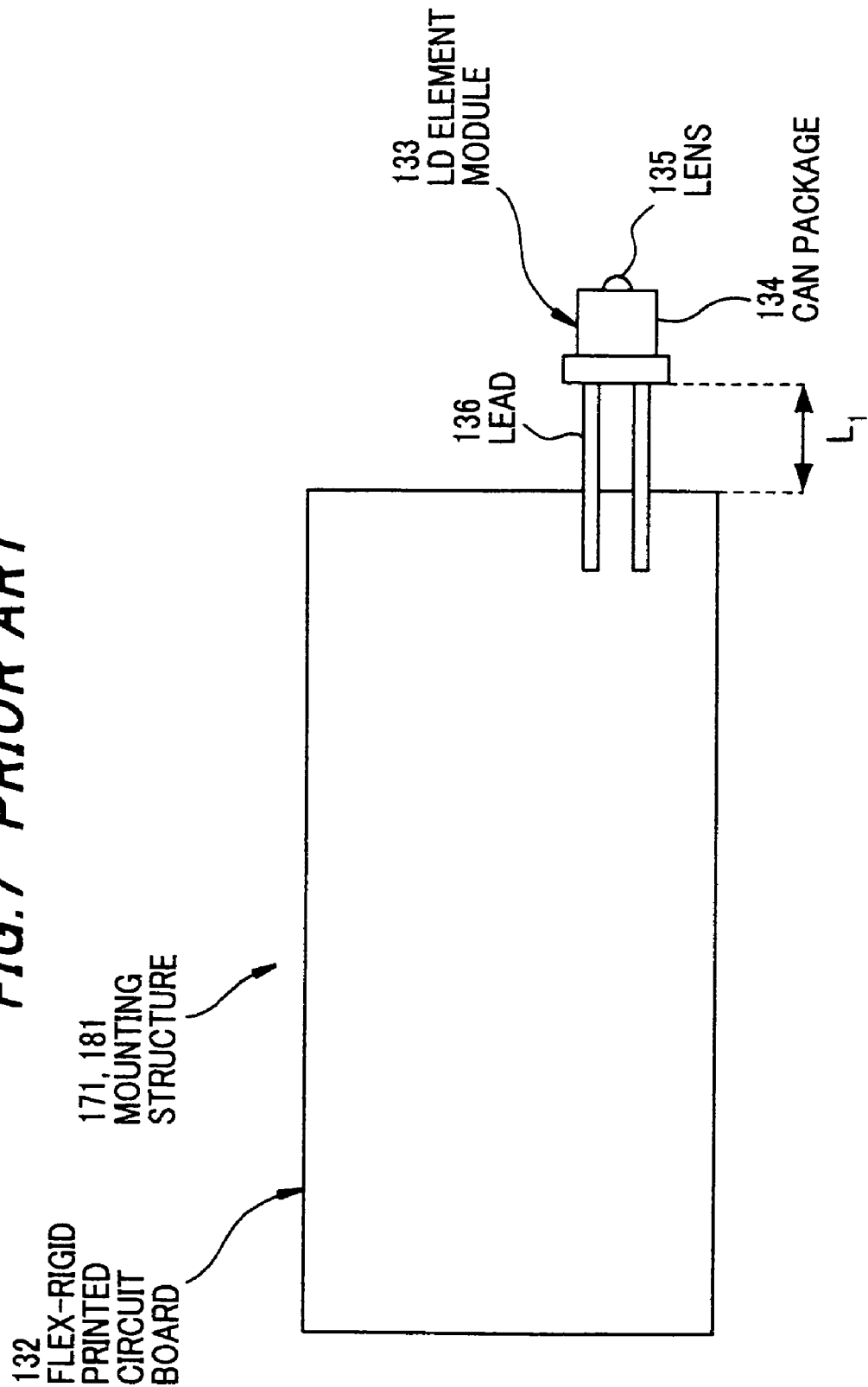
FIG. 7 is a plain view showing mounting structures in FIGS. 5 and 6.

Also, in the electronic component mounting structure 1, the LD element module 133 can be mounted on the board 2 without requiring the lead forming in all the leads 136 of the LD element module 133. Therefore, as compared to the conventional electronic component mounting structure 141 as shown in FIG. 2, the LD element module 133 of the embodiment can be more securely attached to the board 2. Thereby, the stress to the lead 136 can be decentralized and, therefore, the reliability of the lead 136 and the board 2, especially the reliability in connection and operation of component, can be enhanced.

Further, in the electronic component mounting structure 1, the thickness w3 of the step portion can be changed (or adjusted) according to the lead interval w2, by selecting until which layer of the first layer rigid board 2r, the second layer flexible board 2f and the third layer rigid board 2r to be used to form the step portion.

Especially, by using the rigid-flex board 2 as a circuit board, a part of the rigid board 2r can be easily removed as explained in FIGS. 12A and 12B. Thus, the flexible board exposed portion 3 can be easily formed as the step portion with a high precision. In brief, the removal (or peeling) process is very easy.

Although in the first embodiment the board 2 of three-layer structure is used as the rigid-flex board, the other board such as a board with four layers or more may be used. In any case, the relationships, w1>w2 and w3<w2 only have to be satisfied where the thickness of board 2 except the step portion is w1, the lead interval of the LD element module 133 is w2, and the thickness of the step portion is w3.

Figure 11:
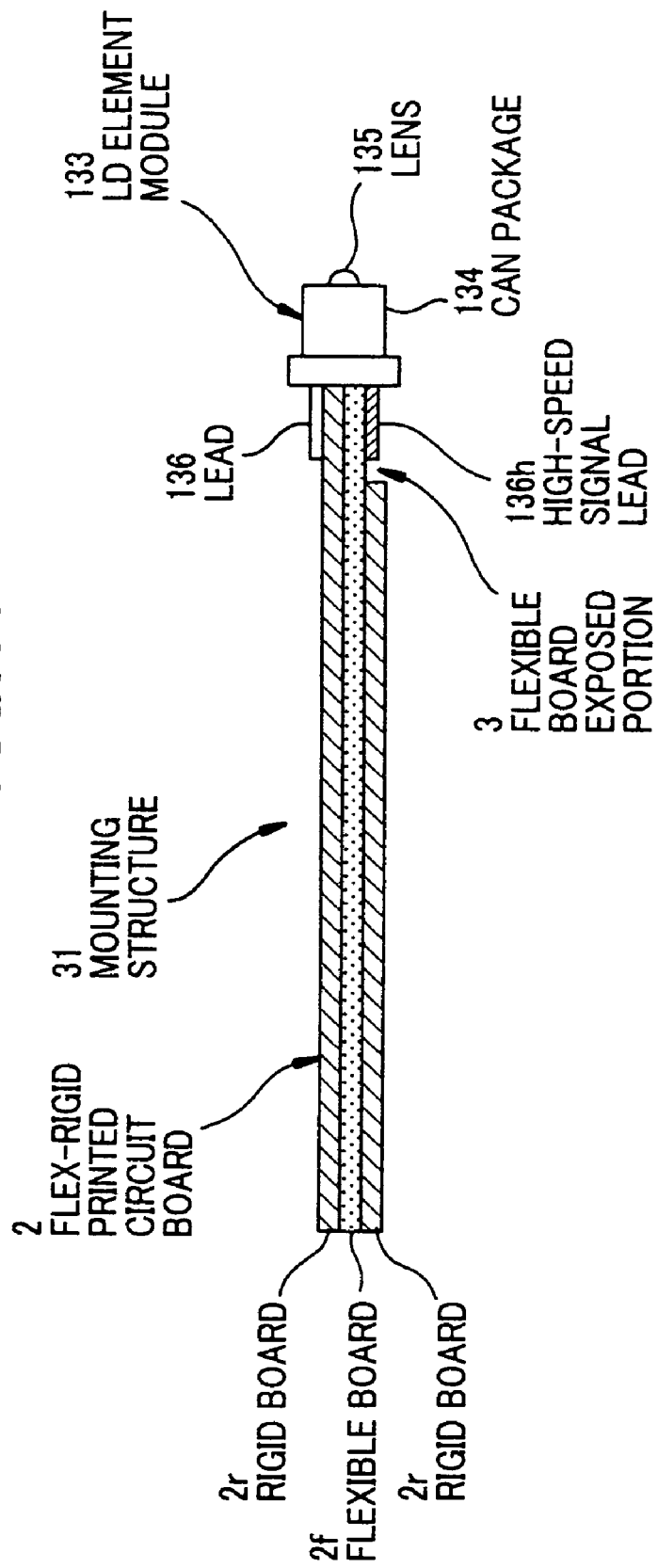
FIG. 11 is a partial cross sectional view showing a modification of the mounting structure in the first embodiment.

The high-speed signal lead 136h may be secured to the surface of the third layer rigid board 2r as the electronic component mounting structure 1 in FIG. 10C or to the surface of the flexible board 2f as an electronic component mounting structure 31 in FIG. 11, if it can be attached substantially linearly and in the shortest distance to the LD element module 133.

Instead of forming the strip-shaped flexible board exposed portion 3 at the end portion on one surface of the board 2, a flexible board exposed portion 73 may be in part formed at the end portion of on one surface as a rigid-flex board 72 in FIG. 15.

Figure 16:
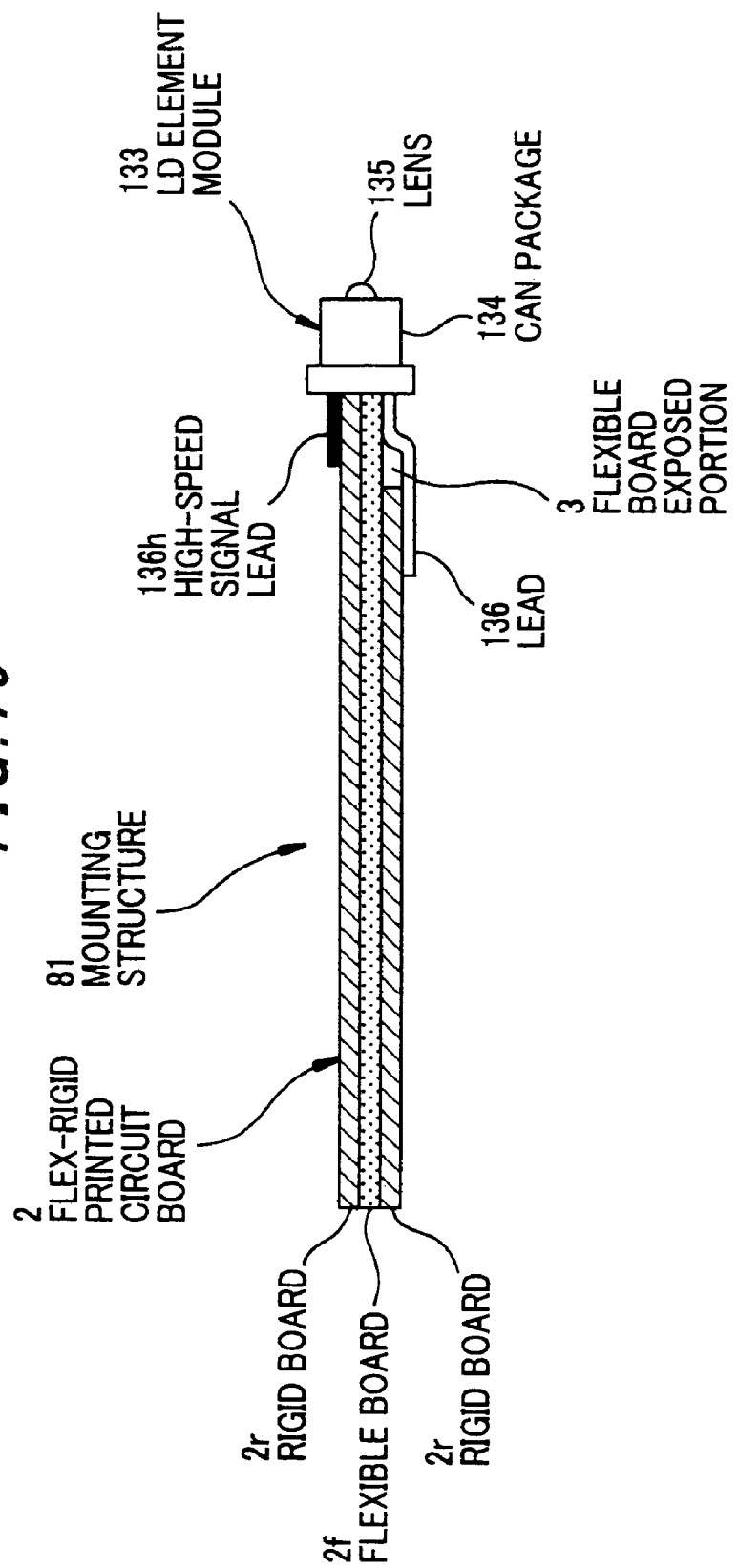
FIG. 16 is a partial cross sectional view showing a modification of the mounting structure in the first embodiment.

As shown in FIGS. 10C and 11, the low-speed signal lead 136 except for the high-speed signal lead 136h can be linearly secured to the second layer flexible board 2f or the third layer rigid board 2r. Alternatively, the low-speed signal lead 136 may be also secured to the first rigid board 2r by bending or the lead forming as an electronic component mounting structure 81 in FIG. 16.

Although in the first embodiment the LD element module 133 is as an electronic component mounted on the board 2, a PD element module (e.g., a package with PD or PD sub-assembly) may be mounted thereon in place of or together with the LD element module 133. In this case, of the plural leads of the PD element module, a high-speed signal lead is connected to an amplifier for amplifying the signal from the PD element module.

(Application of the Electronic Component Mounting Structure 1)

Figure 17:
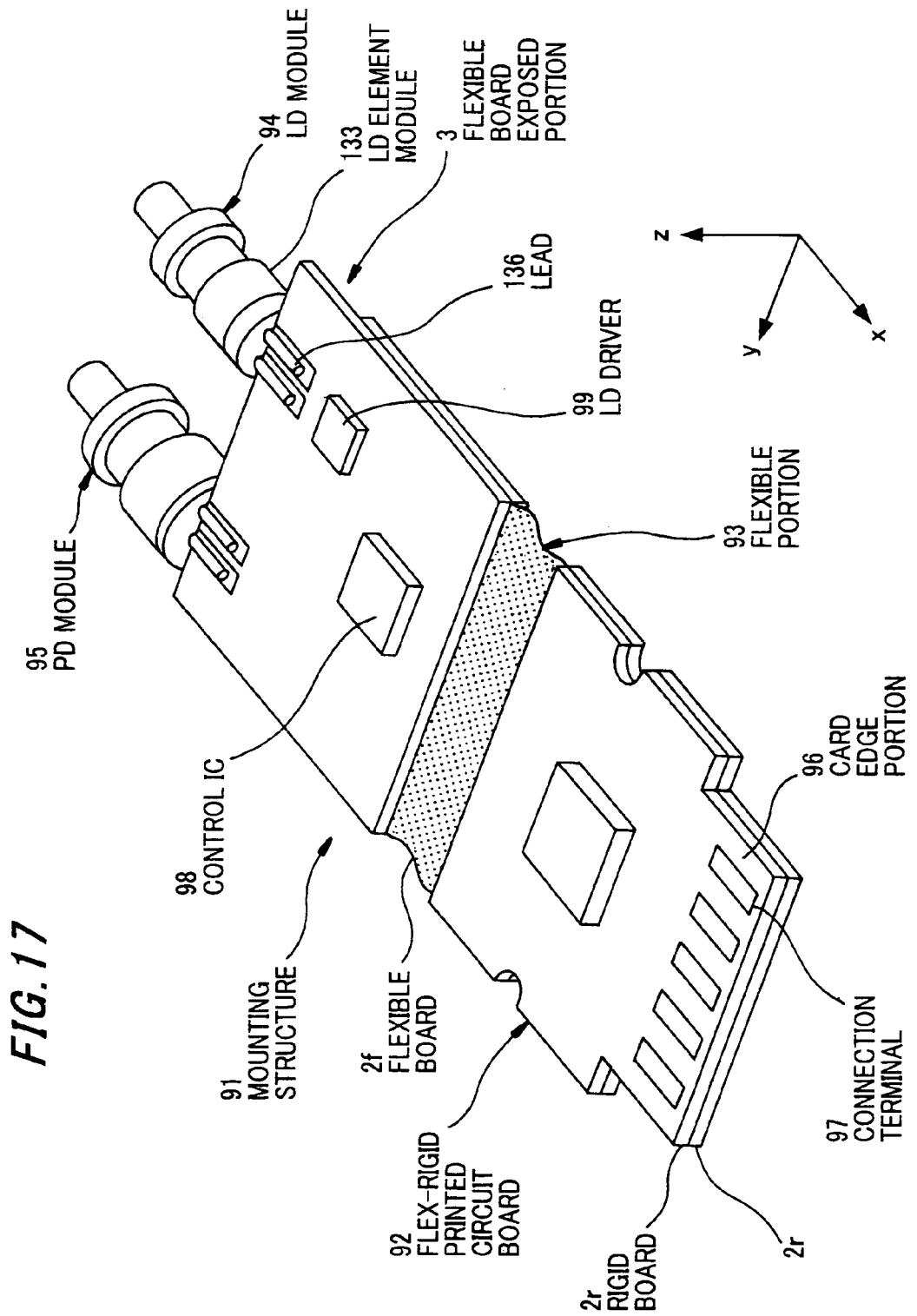
FIG. 17 is a perspective view showing an application of the mounting structure in the first embodiment.

As shown in FIG. 17, in addition to the composition of the rigid-flex board 2 in FIG. 9, an electronic component mounting structure 91 is composed of a flexible portion 93 that is provided midway in a rigid-flex board 92 similar to the rigid-flex board 2. The flexible portion 93 is integrated with the rigid-flex board 92 and is composed of a flexible board 2f so that it can have flexibility.

Attached to the strip-shaped flexible board exposed portion 3 at the end portion on one surface of the rigid-flex board 92 are an LD module 94 as an optical transmission module and a PD module 95 as an optical reception module. The LD module 94 is constructed by providing the LD element module 133 in FIG. 1 with a collar for adjusting the optical axis and a ferule for optically coupling the LD element module 133 to an optical connector (not shown). The PD module 95 is constructed as is the case with the LD module 94.

Formed at the other end of the board 92 is a card edge portion 96 to be inserted into a card edge connector (not shown) as an external device. The card edge portion 96 is provided with connection terminals 97 to electrically connect the board 92 with the external device.

The board 92 is provided with a wiring pattern and terminals. Electronic components mounted on the board 92 are, for example, a control IC 98 to control a signal to be transmitted/received by the LD module 94 and the PD module 95, an LD driver 99 to drive the LD element, and an amplifier (not shown) to amplify a signal from the PD module 95.

(Optical Transceiver using the Electronic Component Mounting Structure 91)

An optical transceiver 101 using the electronic component mounting structure 91 will be explained below.

Figure 18:
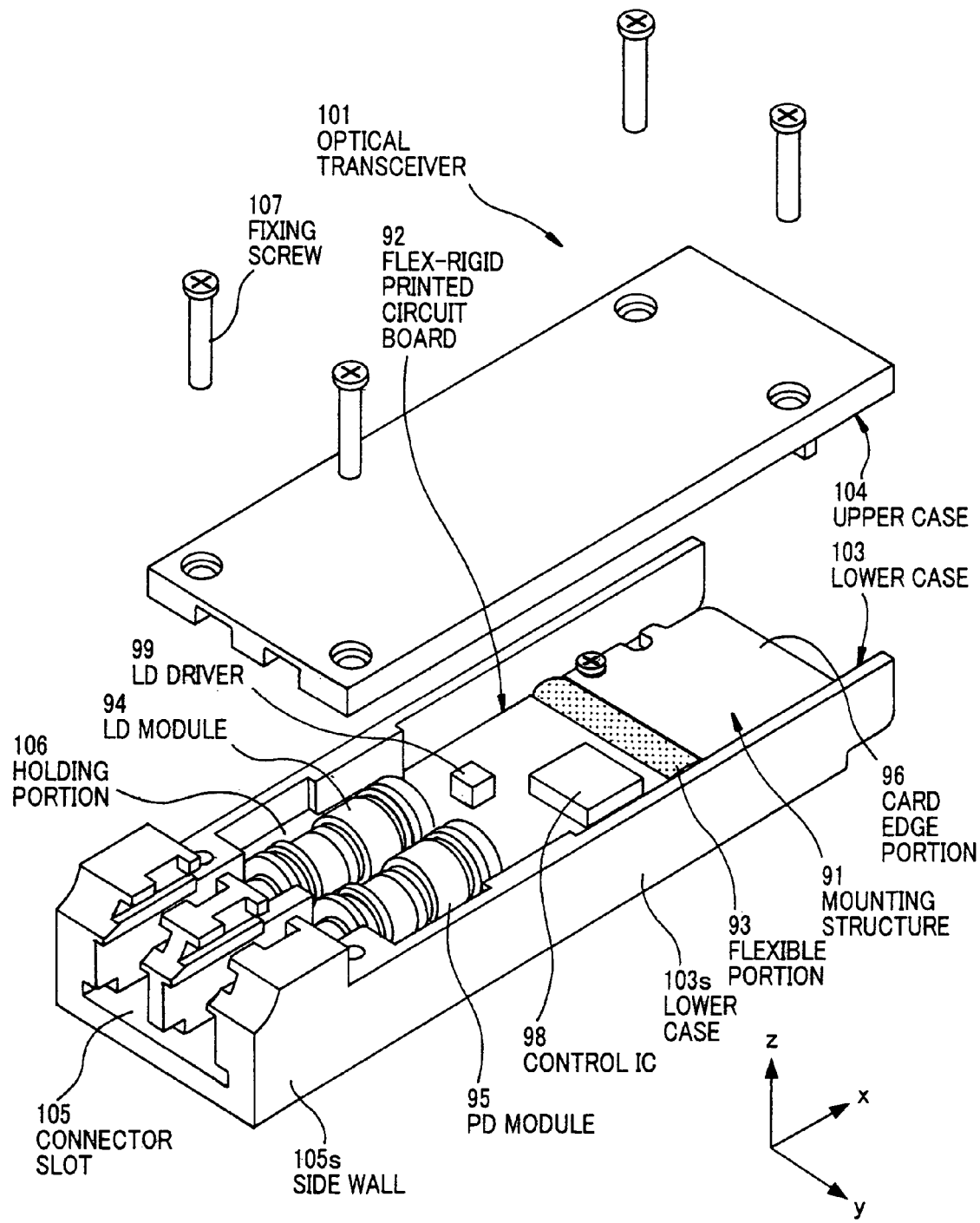
FIG. 18 is a broken perspective view showing an optical transceiver using the mounting structure in FIG. 17.

As shown in FIG. 18, the optical transceiver 101 is mainly composed of: the electronic component mounting structure 1 (i.e., the main body of the optical transceiver 101); a lower case 103 that is nearly in box form and opened on most of the top side and on the back side (i.e., at the other end of the board 92); and an upper case (a lid) 104 that is nearly in planar form and formed to cover most of the opening on the top side of the lower case 103.

The optical transceiver 101 is of a pluggable type that it can be detachably inserted into a front-panel opening of the external device (not shown) at the other end of the board 92 and the optical connector (not shown) can be detachably attached through a connector slot 105. The external device is, for example, a communications device such as a switching hub and a media converter.

The lower case 103 and the upper case 104 are made of a metallic material such as Zn and Al with a high heat radiating property and are in the lump formed by die casting. Alternatively, the lower case and the upper case 104 maybe formed by cutting the metallic material such as Zn and Al with the high heat radiating property.

The lower case 103 is, at its one end, provided with the two connector slots 105 which are formed in parallel and through which the optical connector (not shown) with an optical fiber as a transmission line can be detachably attached. Further, the lower case 103 is provided with a holding portion 106 which is formed back of the connector slots 105 to hold the LD module 94 and the PD module 95.

The connector slot 105 is, at both side walls 105s thereof, provided with a pull-back lever (not shown) to pull back the optical transceiver 101 with the other end of the board 92 from the external device. The lower case 103 has a bottom face that is formed shorter than its side wall 103s in the longitudinal direction while having a reduced length toward the one end (i.e., toward the front end) of the board 92, as shown to the right side in FIG. 18. Namely, the lower case 103 is, at the other end of the board 92, opened on the lower side as well as the upper side and the back side.

The optical transceiver 101 is assembled such that the electronic component mounting structure 91 is placed in the lower case 103, the lower case 103 is covered with the upper case 104, and then the upper case 104 is fixed to the lower case 103 by using four fixing screws 107.

By using the electronic component mounting structure 91, the optical transceiver 101 can have an advantage that the flexible portion 93 can absorb and reduced the stress applied to the board 2, the LD module 94 and the Pd module 95 when attached to/detached from the external device or when the optical connector is attached thereto or detached therefrom.

Also, the optical transceiver 101 can have the same advantages as the electronic component mounting structure 1 in FIG. 10C that the deterioration of the high-speed signal can be prevented as much as possible and the high reliability of the lead 136 and the board 92 can be obtained.

Second Embodiment

Figure 8:
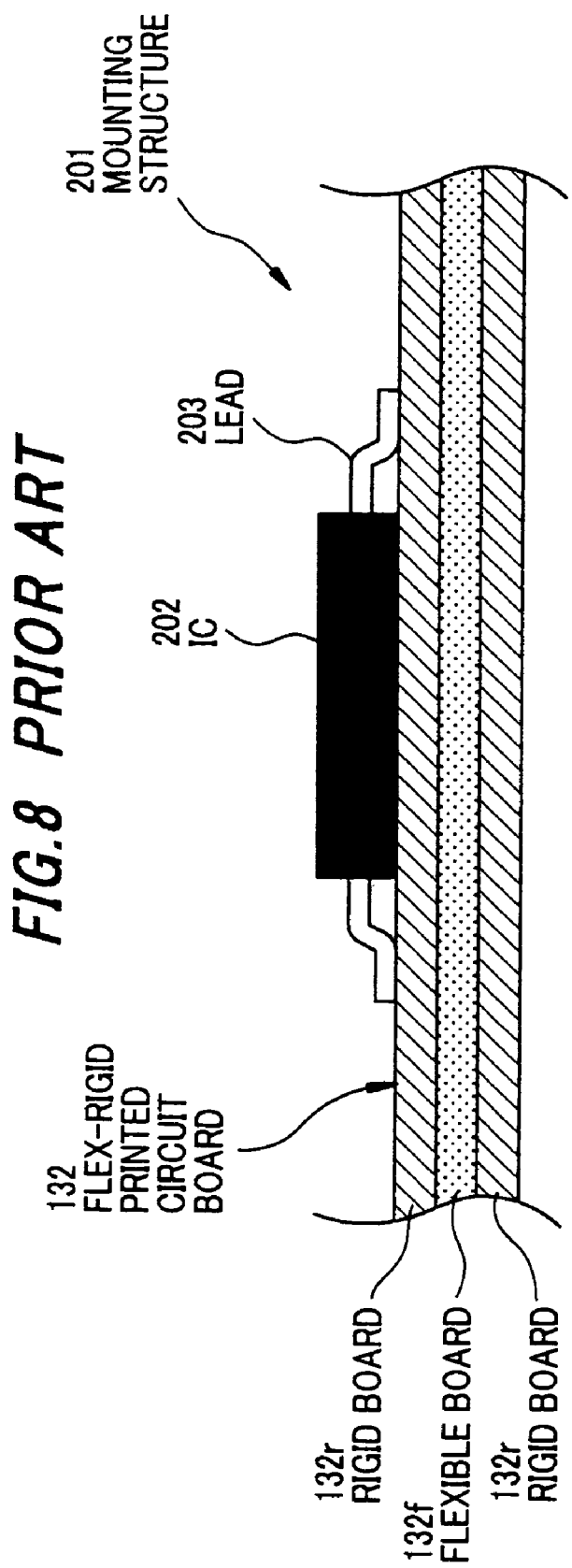
FIG. 8 is a partial cross sectional view showing the third conventional method of mounting an electronic component.

As shown in FIG. 19, an electronic component mounting structure 111 is composed such that a flexible board exposed portion 113 with the flexible board 2f exposed is, as a step portion, in part formed at the central portion of the board 2, a metal layer 112 of a metallic material with a high heat radiating property is formed on the flexible board exposed portion 113, and an IC 202, the electronic component as described in FIG. 8 is mounted on the metal layer 112. However, leads 203 of the IC 202 are linearly attached on the surface of the first layer rigid board 2r.

The metal layer 112 is formed by conducting, e.g., Cu plating on the surface of the flexible board exposed portion 113. The flexible board exposed portion 113 is formed such that, by the same way as shown in FIGS. 12A to 16, the first layer rigid board 2r on one side of board 2 is previously perforated and then a part of the central portion of the first layer rigid board 2r is removed (peeled) along the perforated line or curve.

In the electronic component mounting structure 111, since the flexible board exposed portion 113 is formed at the central portion of the board 2, it is not necessary to process the lead 203 by the lead forming when mounting on the board 2 the IC 202 with the plural leads 203 extending linearly in the horizontal direction from its side wall. Therefore, it can prevent deterioration in the RF characteristics.

Further, since the flexible board exposed portion 113 is not provided with the adhesive material (the adhesive layer 41) as described in the first embodiment (See FIG. 12B), an electronic component as the LD element module 133 can be easy to mount thereon.

Further, in the electronic component mounting structure 111, since the metal layer 112 is formed on the flexible board exposed portion 113 while contacting the bottom of the IC 202, heat generated from the IC 202 can be radiated in the horizontal direction through the metal layer 112 from the bottom of the IC 202. Thus, it has a high heat radiating property.

Also, the electronic component mounting structure 111 can be applied to the electronic component mounting structure 91 as described referring to FIG. 17, and it can be applied to the optical transceiver 101 as described referring to FIG. 18.

Although in the above embodiments the rigid-flex board 2 is used as the circuit board, another circuit board may be used that is all composed of a rigid board. For example, the flexible board 2f of the rigid-flex board 2 as explained referring to FIGS. 9 and 19 may be replaced by the rigid board 2r.

Third Embodiment

As shown in FIGS. 20A and 20B, an electronic component mounting structure 121 is composed such that a concave portion 123 is formed along the length direction of a circuit board 122 at an end face of the circuit board 122, and a ground(GND) lead 136g of the LD element module 133 is inserted and secured within the concave portion 123.

The circuit board 122 is composed of, e.g., a rigid board in single layer structure. The lead 136g has a diameter slightly greater than the other lead 136. The lead 136g is secured within the concave portion 123 through a connection member j and nearly its entire portion is embedded inside the end face of the circuit board 122. The connection member j is made of, for example, an end-face plating, a solder and a conductive adhesive material. The other lead 136 is secured by soldering on the back surface of the circuit board 122. The concave portion 123 is formed by, e.g., cutting the end face of the circuit board 122 by using a cutting means such as a router. The electronic component mounting structure 121 can have the same effects and functions as the electronic component mounting structure 1 in FIG. 9. Especially, in the electronic component mounting structure 121, since the ground lead 136g with a diameter greater than the other lead 136 is secured within the concave portion 123, the connection strength between the circuit board 122 and the LD element module 133 can be enhanced.

The electronic component mounting structure 121 can be also applied to the optical transceiver 101 as shown in FIG. 18.

Although in the third embodiment the ground lead 136g is inserted and secured within the concave portion 123, the other lead 136 may be inserted and secured within the concave portion 123. Although the rigid board in single layer structure is used as the circuit board 122, a rigid board in multilayer structure may be used as the circuit board 122.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A mounting structure for electronic components, comprising:
    a rigid-flex board comprising a thickness w1;
    an electronic component mounted on the rigid-flex board, the electronic component comprising a lead interval w2 that is smaller than the thickness w1,
    wherein the rigid-flex board comprises a step portion formed at one end portion thereof, and
    the step portion is sandwiched by a lead for transmitting electric signals of the electronic component so as to secure the lead to the step portion,
    wherein:
    the rigid-flex board comprises a flexible board;

the step portion comprises a flexible board exposed portion at which the flexible board is exposed.

2. The mounting structure according to claim 1, wherein:
the lead is secured substantially linearly to the step portion.

3. The mounting structure according to claim 1, wherein:
the step portion comprises a thickness w3, and
the thickness w3 is smaller than the lead interval w2.

4. The mounting structure according to claim 1, wherein:
the step portion is formed in part at the one end portion of the rigid-flex board.

5. The mounting structure according to claim 1, wherein:
the step portion is formed by perforating a region on one surface of the rigid-flex board, and then peeling a part of the rigid-flex board corresponding to the perforated region so as to reduce the thickness of the rigid-flex board at the region.

6. An optical transceiver, comprising:
a mounting structure;
wherein the mounting structure comprises:
a rigid-flex board comprising a thickness w1;
an electronic component mounted on the rigid-flex board, the electronic component comprising a lead interval w2 that is smaller than the thickness w1,
wherein the rigid-flex board comprises a step portion formed at one end portion thereof, and
the step portion is sandwiched by a lead for transmitting electric signals of the electronic component so as to secure the lead to the step portion,
wherein:
the rigid-flex board comprises a flexible board;
the step portion comprises a flexible board exposed portion at which the flexible board is exposed.

7. An optical transceiver, comprising:
a mounting structure;
wherein the mounting structure comprises:
a rigid flex board; and
an electronic component mounted on the rigid flex board;
wherein the rigid flex board comprises a concave portion formed at an end face thereof, and
the electronic component comprises a lead for transmitting electric signals, the lead being inserted and secured within the concave portion.

* * * * *